(12) United States Patent
Takahashi

(10) Patent No.: US 6,258,241 B1
(45) Date of Patent: Jul. 10, 2001

(54) PROCESS FOR ELECTROPLATING METALS

(75) Inventor: Ken M. Takahashi, Warren, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 08/988,420

(22) Filed: Dec. 10, 1997

(51) Int. Cl.⁷ .............. C25D 5/54; C25D 5/56; C25D 5/10; C23C 28/02

(52) U.S. Cl. ............ 205/159; 205/164; 205/184; 205/104; 205/170; 205/241; 205/263; 205/271; 205/266; 205/283; 205/252; 205/291; 205/300; 205/305; 205/158

(58) Field of Search .................. 205/159, 164, 205/184, 104, 170, 241, 263, 271, 266, 283, 252, 291, 300, 305, 158

(56) References Cited

U.S. PATENT DOCUMENTS

| | | | |
|---|---|---|---|
| 4,038,042 | * 7/1977 | Adelman | 428/625 |
| 4,347,108 | * 8/1982 | Willis | 204/52 R |
| 4,374,709 | 2/1983 | Combs | 204/30 |
| 4,473,448 | * 9/1984 | Deeman | 204/51 |
| 4,666,567 | * 5/1987 | Loch | 204/14.1 |
| 4,673,469 | * 6/1987 | Beach et al. | 204/38.4 |
| 5,275,715 | * 1/1994 | Tuttle | 205/123 |
| 5,328,589 | 7/1994 | Martin | 205/296 |

OTHER PUBLICATIONS

Antisiferov, et al., "Electrodeposition of Metals on Highly Porous Cellular Materials," Proc. Int. Conf. Surf. Sci. Eng. (1995), Abstract, No Month available.

* cited by examiner

Primary Examiner—Edna Wong
(74) Attorney, Agent, or Firm—Venable; Jeffrey W. Gluck; Michael A. Sartori

(57) ABSTRACT

A process for electroplating metal on a resistive substrate and the article of manufacture produced therefrom are disclosed. The metal layer is electroplated onto the resistive substrate in an electroplating bath having a polarization parameter $\xi$ less than approximately 10 such that the metal layer is of substantially uniform thickness. The polarization parameter $\xi$ of less than approximately 10 for the electroplating bath can be achieved by numerous means, such as by providing a low metal ion concentration in the electroplating bath or by adding one or more additives to the electroplating bath. The present invention may be used with a variety of metals and resistive substrates.

26 Claims, 2 Drawing Sheets

PROCESS FOR ELECTROPLATING METALS

BACKGROUND OF THE INVENTION

The present invention relates to electroplating metals. In general, metals are difficult to electroplate to a resistive substrate, such as a conductive plastic, a carbon-filled plastic, an insulator with a resistive coating, and a resistive porous electrode. Because of the resistivity of the substrate, metal ions in the electroplating bath are deposited around electrical contact points of the resistive substrate, causing a non-uniform metal layer to develop on the substrate. In particular, a large accumulation of the metal will occur around the electrical contact points, and a negligible amount of metal will accumulate elsewhere.

For example, as shown in the cross-sectional view of FIG. 1, to electroplate a copper layer 1 onto a silicon wafer 2, a barrier film 3 having resistive properties is first placed on the silicon wafer 2. Conventionally, when copper is electroplated onto the barrier film, copper is deposited around the electrical contact points, which are usually located on the perimeter of the silicon wafer. This resulting copper layer is non-uniform, as illustrated in FIG. 1. In particular, the copper is deposited in an upwardly extending rim around the perimeter of the barrier film 3, and negligible amounts of copper are deposited in the middle of the barrier film 3.

To correct for this non-uniform layer, an initial copper layer is deposited on the barrier film through a means other than electroplating. For example, sputtering, chemical vapor deposition or electroless plating is conventionally used to deposit the initial copper layer on the barrier film. This results in forming a layer with relatively low resistance, and which is conducive to being electroplated with copper. However, this conventional approach has drawbacks. In particular, the sputtering and chemical vapor deposition are expensive. Moreover, electroless plating is slow and is difficult to control. Thus, improved methods for electroplating metals, particularly copper, onto a resistive substrate are desired.

SUMMARY OF THE INVENTION

It is an object of the present invention to provide a process for electroplating a metal layer having substantially uniform thickness onto a resistive substrate. The phrase "substantially uniform thickness" defines a metal layer thickness having a minimum thickness of approximately the same order of magnitude as the maximum thickness for the metal layer, and the phrase "non-uniform thickness" defines a metal layer thickness that is not substantially uniform.

It is another object of the present invention to provide a process for electroplating a metal layer having substantially uniform thickness onto a thin resistive film covering a resistive or insulating substrate.

It is a further object of the present invention to provide a process for electroplating a metal layer having substantially uniform thickness onto a resistive substrate without first depositing a non-resistive layer on the resistive substrate.

It is an additional object of the present invention to electroplate a metal layer having substantially uniform thickness onto a resistive substrate without first depositing a film of the metal using, for example, sputtering, chemical vapor deposition or electroless plating.

The above objects and advantages of the present invention are achieved by a process for electroplating metal on a resistive substrate and by an article of manufacture derived therefrom. The method comprises electroplating a metal layer onto the resistive substrate in an electroplating bath having a polarization parameter $\xi$ less than approximately 10 such that the metal layer is substantially uniform. In particular, the polarization parameter $\xi$ is defined as $\xi = i_o r_1^2 \alpha_c F / \kappa h R T$, where $i_o$ is the exchange current density of the electroplating bath; $r_1^2$ is the square of the maximum distance between a point of the electroplated area and the nearest point of electrical contact with a power supply lead; $\alpha_c$ is the cathodic transfer coefficient; F is Faraday's constant; $\kappa$ is the conductivity of the metal; h is the thickness of the metal layer; R is the gas constant; and T is the temperature. Note that the exchange current density, $i_o$, is defined based on a kinetic model, for example, the Butler-Volmer model discussed below (see Eqn. (7) and its surrounding discussion).

A polarization parameter $\xi$ of less than approximately 10 can be achieved, for example, by a low metal ion concentration of less than approximately $0.1 \times 10^{-3}$ mole/cm$^3$ (or 0.1 M) in the electroplating bath, by adding an additive to the electroplating bath, or by both providing a low metal ion concentration and adding an additive to the electroplating bath.

A substrate is defined to be resistive if it has a film resistance parameter Rf greater than approximately 10 ohm-cm$^2$, where the film resistance parameter Rf is defined as $Rf = r_1^2 / \kappa h$.

Before electroplating the metal layer, a thin resistive film can be provided on the resistive substrate, where the thin resistive film comprises a material other than the material of the resistive substrate. Further, before electroplating the metal layer, an initial metal layer can be deposited on the resistive substrate, or on a thin resistive film first provided on the resistive substrate.

To increase the rate at which the metal is electroplated after an initial metal layer is formed using the electroplating bath having a polarization parameter $\xi$ less than approximately 10, the metal ion concentration in the electroplating bath can be increased or the resistive substrate with the formed initial layer can be transferred to a conventional electroplating bath.

In addition, to increase the rate at which the metal is electroplated after the initial metal layer is formed, the plating current density $i_s$ in the electroplating bath can be increased in relation to the increasing thickness of the metal layer while keeping the polarization parameter $\xi$ constant.

Further, the electroplating can be accomplished by pulse electroplating.

Moreover, a product can be produced according to the process of the present invention.

The article of manufacture comprises a resistive substrate and a metal layer of substantially uniform thickness electroplated onto the resistive substrate in an electroplating bath having a polarization parameter $\xi$ less than approximately 10.

The above objects and advantages of the present invention are illustrative, and not exhaustive, of those which can be achieved by the present invention. Thus, these and other objects and advantages of the present invention will be apparent from the description herein or can be learned from practicing the invention, both as embodied herein and as modified in view of any variations which may be apparent to those skilled in the art.

BRIEF DESCRIPTION OF THE DRAWINGS

The present invention will be described in greater detail below by way of reference to the accompanying drawings wherein.

DETAILED DESCRIPTION OF THE PREFERRED EMBODIMENTS

Figure 1:
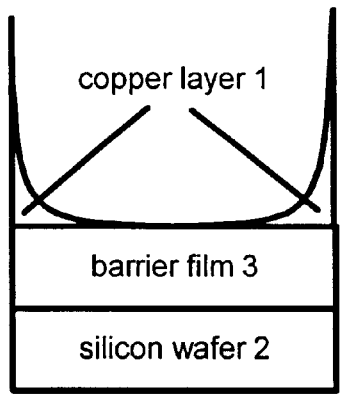
FIG. 1 illustrates a cross-sectional view of the structure resulting from conventionally electroplating copper on a barrier film, which is deposited on a silicon wafer. Metal is deposited thickly near the edges of the device where electrical contacts are made and deposited relatively thinly elsewhere.
Figure 2:
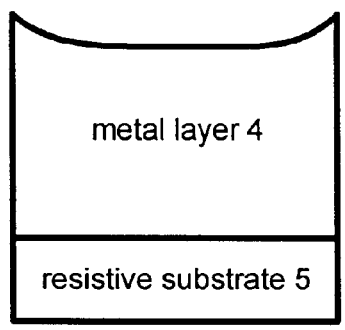
FIG. 2 illustrates a cross-sectional view of the structure resulting from electroplating a metal layer on a resistive substrate according to the present invention.

In the present invention, the process for electroplating metal on a resistive substrate comprises electroplating a metal layer onto the resistive substrate in an electroplating bath having a polarization parameter $\xi$ less than approximately 10 such that the metal layer is substantially uniform. The article produced using this process is illustrated in FIG. 2, where a metal layer 4 is shown electroplated onto a resistive substrate 5.

A polarization parameter $\xi$ less than approximately 10 can be achieved by imposing low electroplating kinetics. "Low electroplating kinetics" exists with a low exchange current density $i_o$, where the exchange current density $i_o$ is a characteristic kinetic parameter of the electroplating bath and is explained below in the discussion of equation (7). The plating rate and the plating current density is depend on the electroplating kinetics of the electroplating bath, which is characterized by the exchange current density $i_o$, and an applied interfacial over-potential $\eta$, as explained below in the discussion of equations (5)–(7). Up to a point, electroplating at a low interfacial over-potential $\eta$ and, therefore, at a low plating current density $i_s$, results in more uniform metal deposits than at a high current density $i_s$, as is normally employed in conventional commercial electroplating processes. However, reducing the current density $i_s$ below the exchange current density $i_o$ results in limited further gain in the uniformity of the metal layer. As described below, modifying the electroplating bath to provide reduced exchange current density $i_o$ can produce the desired uniformity, while lowering the plating current density $i_s$ alone cannot produce the desired uniformity.

By having low electroplating kinetics in the electroplating bath, the inventor has discovered that the metal layer formed on the resistive substrate is substantially uniform, and not non-uniform as in the conventional approach. With the present invention, low plating rates can be used to provide substantially uniform deposits, if electroplating kinetics are made to be low. To obtain low electroplating kinetics, a low metal ion concentration is provided in the electroplating bath. This is counter-intuitive to the conventional approach, in which high metal ion concentrations are desired, to facilitate mass transfer and fast build-up of the metal layer, within the limits imposed by the electroplating solution resistance. "Low metal ion concentration" means metal ion concentration well below the level chosen to maximize the plating rate. Conventionally, metal ion concentration is typically on the order of $1.0 \times 10_{-3}$ mole/cm$^3$ (or 1 M). In a preferred embodiment, the metal ion concentration is lower than the conventional level by approximately one order of magnitude to approximately four orders of magnitude. In another preferred embodiment, the metal ion concentration is less than approximately $0.1 \times 10^{-3}$ mole/cm$^3$ (or 0.1 M). In still another preferred embodiment, the metal ion concentration is less than approximately $0.1 \times 10_{-6}$ mole/cm$^3$ (or 0.1 mM). If the metal is copper, the copper ion concentration is preferably less than approximately $0.25 \times 10^{-3}$ mole/cm$^3$ (or 0.25 M).

Initially, the low metal ion concentration and low plating current density required to obtain a uniform deposit limit the plating rate. However, as the electroplated metal layer builds up, the effective resistance of the combined metal layer and the resistive substrate is decreased, which allows the plating rate to be increased. Moreover, once the deposited metal layer lowers the effective substrate resistance, the metal ion concentration can be increased in the electroplating bath to enable high-rate electroplating.

Low electroplating kinetics can also be obtained by adding one or more additives to the electroplating bath. For example, an organic additive can be added to the electroplating bath to obtain low electroplating kinetics. Examples of organic additives include: polyamines; polyethers; and sulfur-containing brighteners, like thiourea. It should be noted that this example, as are all the examples described herein for the present invention, is a non-limiting example.

To obtain low electroplating kinetics, a combination of both providing a low metal ion concentration in the electroplating bath and adding one or more additives to the electroplating bath can be used.

As described in detail below, low electroplating kinetics can be obtained, producing a low polarization parameter $\xi$ in the electroplating bath, where the polarization parameter $\xi$ is a dimensionless parameter that characterizes the electroplating. In particular, $$\xi = i_o r_1^2 \alpha_c F / \kappa h RT \tag{1}$$

where $i_o$ is the exchange current density of the electroplating bath; $r_1^2$ is the square of the maximum distance between a point of the electroplated area and the nearest point of electrical contact with a power supply lead; $\alpha_c$ is the cathodic transfer coefficient; F is Faraday's constant; $\kappa$ is the conductivity of the metal; h is the thickness of the metal layer; R is the gas constant; and T is the temperature.

For the above equation (1), any self-consistent set of units can be used. For example, $i_o$ can be expressed in Amp/cm$^2$, $r_1$ in cm, $\alpha_c$ is dimensionless, F in coulomb/mole, $\kappa$ in (Ohm-cm)$^{-1}$, h in cm, R in Joule/K mole, and T in K.

To achieve a metal layer of substantially uniform thickness, the polarization parameter $\xi$ is preferably less than approximately 10. Alternatively, the polarization parameter $\xi$ is less than approximately 1. As an additional alternative, $\xi$ is less than approximately 0.001. By definition, $\xi$ is always greater than or equal to zero. In general, as discovered by the inventor, to increase the uniformity of the metal layer, $\xi$ should be decreased. It should be noted that the polarization parameter $\xi$ is general and applicable to any metal.

By providing a low metal ion concentration in the electroplating bath or by adding one or more additives to the electroplating bath, a $\xi$ of less than approximately 10 can be obtained. Moreover, one of ordinary skill in the art after examining the teachings of the inventor and the polarization parameter $\xi$ will be able to adjust other parameters of the electroplating bath to obtain a low $\xi$ and hence to obtain low electroplating kinetics for the electroplating bath. For example, the exchange current density $i_o$ can be made low. For copper electroplating onto a resistive substrate, like a silicon wafer covered with a resistive barrier film, the exchange current density is preferably less than approximately 5 mA/cm$^2$. As another example, the temperature T can be increased to obtain a low $\xi$.

With the present invention, a metal layer is electroplated on a resistive substrate. A "resistive substrate" is defined by breaking the polarization parameter into a film resistance parameter Rf and a plating kinetics parameter Kp:

$$\xi=Rf*Kp \quad (2)$$

where $$Rf=r_1^2/\kappa h=\rho_s r_1^2 \quad (3)$$

$$Kp=\alpha_c F i_o/RT \quad (4)$$

where Rf can be expressed in (ohm-cm$^2$), and Kp can be expressed in (ohm-cm$^2$)$^{-1}$. Instead of using $\kappa$ and h separately in the film resistance parameter Rf, the film resistance parameter Rf can be defined using the directly measurable sheet resistance $\rho_s=1/\kappa h$ of the resistive substrate or of a coating on the resistive substrate, where $\rho_s$ can be expressed in ohms/square.

A substrate is defined to be resistive if it has a film resistance parameter Rf greater than approximately 10 ohm-cm$^2$. For example, the resistive material can be a conductive plastic, a carbon-filled plastic, an insulator with a resistive coating, or a resistive porous electrode.

If the metal layer is copper, a substrate having a film resistance parameter Rf greater than approximately 10 ohm-cm$^2$ is resistive enough such that the present invention significantly improves the uniformity of an electroplated deposit over conventional electroplating. A substrate having a film resistance parameter Rf greater than approximately 100 ohm-cm$^2$ is very resistive, and the present invention is required to obtain a uniform deposit because conventional electroplating is unable to do so.

Figure 4:
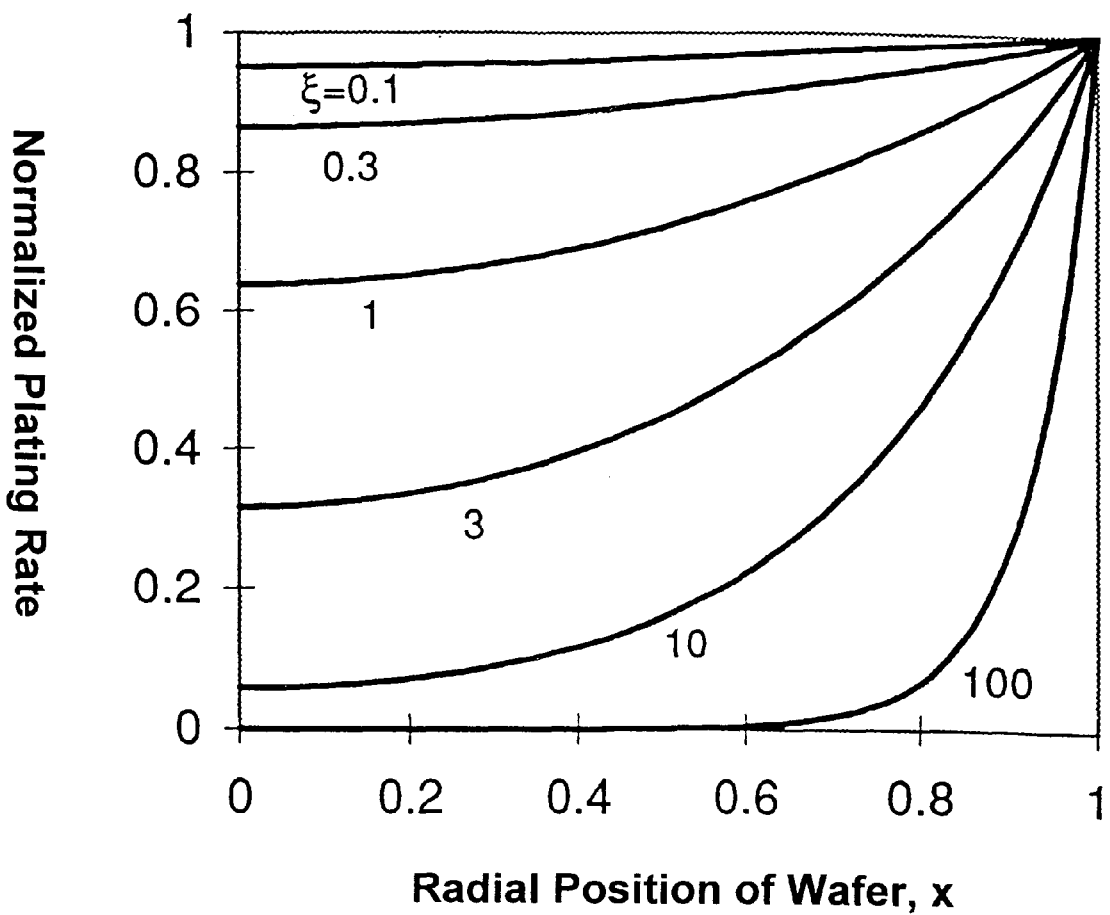
FIG. 4 illustrates the relationship between the radial position and normalized plating rate when electroplating copper at the limit of low current density.

In a preferred embodiment, if a polarization parameter $\xi$ of less than approximately 10 is required to produce the desired uniformity, as shown in FIG. 4, low electroplating kinetics can be achieved for a plating kinetic parameter Kp of less than approximately 10/Rf. If a polarization parameter $\xi$ of less than approximately 0.001 is required to produce the desired uniformity, as shown in FIG. 4, low electroplating kinetics can be achieved for a plating kinetic parameter Kp of less than approximately 0.001/Rf.

With the present invention, the electroplated metal layer can be any metal which can be electroplated. For example, copper, silver, gold, nickel, tin, solder, chromium, zinc, and bronze can be used as the metal.

Figure 3:
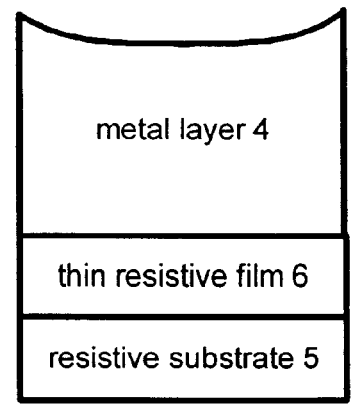
FIG. 3 illustrates a cross-sectional view of the structure resulting from electroplating a metal layer on a thin resistive layer, which is first deposited on a resistive substrate, according to the present invention.

If the metal to be electroplated and the resistive substrate have an adverse interaction, like poor adhesion or interdiffusion which occur with copper and silicon, a thin resistive film of a material other than that used for the resistive substrate, and which does not have an adverse reaction with the metal, can be provided on the resistive substrate before electroplating the metal layer. This is illustrated in FIG. 3, where a metal layer 4 is shown electroplated onto a thin resistive film 6, which is first provided on a resistive substrate 5.

In other words, a thin resistive film of a material other than that of the resistive substrate is first provided on the resistive substrate, and then the metal layer is electroplated on the thin resistive film. The thin resistive film can also be a barrier film. Examples of materials which may have adverse interactions with a metal layer are silicon and gallium arsenide; such materials may also have a dielectric layer, for example, in the case of partially completed integrated circuits. Examples of a thin resistive film to provide on the resistive substrate include titanium nitride, titanium silicide, titanium nitride silicide, tantalum, tantalum nitride, tantalum silicide, and tantalum nitride silicide.

In an alternative embodiment, an initial metal layer can first be deposited on the resistive substrate before electroplating the metal layer according to the present invention. For example, the initial metal layer can be deposited by sputtering chemical vapor deposition or electroless plating.

In another alternative embodiment, the electroplating of the metal layer is achieved by pulse electroplating. This is desirable when the metal layer is approaching non-uniformity. This alternative embodiment is discussed in more detail below.

Moreover, the resistive substrate can be any physical form conducive to electroplating. For example, the resistive substrate can be a wafer used in the manufacture of integrated circuits, a bumper for a car, or even a baby's shoe.

ILLUSTRATION

The following illustrates an embodiment of the present invention. As depicted in FIG. 3, the metal layer 4 is assumed to be copper, and the resistive substrate 5 is assumed to be silicon with a thin resistive film 6, which is a barrier film, deposited thereon. The resistive substrate is further assumed to be an approximately circular silicon wafer, such as those used in the production of integrated circuits. The wafer surface may be populated with partially completed integrated circuits, the top layer of which consists of a patterned dielectric layer. Dielectric layers may be solid or porous, and they can comprise, for example, silicon dioxide, fluorinated silicate glass, or polymers, such as siloxanes, polyimides, polyarylene ethers, or poly-para-xylylenes.

To calculate the effect of metal film conductance on the uniformity of electroplated copper, the approximately circular wafer is assumed to have a barrier film across the wafer and to have electrical contact points spaced about the perimeter of the wafer. To isolate the effects of film resistance, solution-phase potential is assumed to be independent of position, and the over-potentials that drive the electroplating reaction are assumed to vary only with the potential in the metal film.

The barrier film current density $i_m$ obeys Ohm's Law:

$$i_m=-\kappa\nabla\eta \quad (5)$$

where $\kappa$ is the conductivity of the barrier film, and $\nabla\eta$ is the gradient of the interfacial over-potential.

Because the barrier film and electroplated metal layer are thin compared to the wafer dimensions, the plating reaction can be treated as a homogeneous source of current:

$$\nabla\cdot i_m=-\kappa\nabla^2\eta=-ai_s(\eta) \quad (6)$$

where a is the film area per unit volume and is the inverse of the thickness h. Initially, h refers to the thickness and $\kappa$ is the conductivity of the barrier film. As a copper layer builds up, h and $\kappa$ are effective values reflecting the composite properties of both the barrier film and the metal layer.

The copper plating current density is is generally found to depend on the interfacial over-potential $\eta$ according to Butler-Volmer kinetics:

$$i_s=i_o(e^{\alpha_a F\eta/RT}-e^{\alpha_c F\eta/RT}) \quad (7)$$

where $i_o$ is the exchange current density, $i_o=2Fk_s[Cu^{+2}]^\gamma$ for copper deposition, the rate constant $k_s$ being dependent on the electroplating bath and any additives; $\alpha_a$ is the anodic symmetry factor; $\alpha_c$ is the cathodic symmetry factor; F is Faraday's constant; R is a gas constant; T is temperature; and $\gamma$ is the reaction rate order of the copper ion concentration and depends on the details of the electroplating bath composition. For the illustration here, only the qualitative features of equation (7) are important: plating rate is proportional to $i_o$, linear in $\eta$ at low values of $\eta$, and exponential in $\eta$ at high (negative) values of $\eta$.

In the following, an estimate is derived for the rate of copper deposition that can be supported without incurring severe non-uniformity in the metal layer due to ohmic potential drop in the conductive film. Assuming that, to the first order, $i_s$ is constant over the wafer surface, the potential distribution in the conductive film can be calculated to determine which combinations of electroplating parameters are consistent with a uniform current distribution such that a copper layer of uniform thickness develops.

Assuming that is is roughly constant over the wafer surface, a one-dimensional approximate solution to equation (6) can be obtained:

$$(\phi/\phi_1) = 1 - (\xi i^*/4\phi_1)(1-x^2) \quad (8)$$

where x is the radial position r over the wafer radius $r_1$, with x=0 being the point at the center of the wafer and x=1 being a point at the edge of the wafer; $\phi$ is the dimensionless potential $\phi = \alpha_c F\eta/RT$; $i^* = i_s/i_o$; $\phi_1 = \phi$ evaluated at x=1; and $\xi = i_o r_1^2 \alpha_c F/\kappa hRT$ is the polarization parameter of equation (1).

The dimensionless parameter $$\xi i^*/4\phi_1 \quad (9)$$

therefore defines the conditions under which the metal can be electroplated uniformly. The electroplating rate is uniform across the wafer radius only if the potential $\phi$ is nearly constant (i.e., $\xi i^*/4\phi_1 \ll 1$). The dimensionless parameter of equation (9) has two components: $\xi$, which contains intrinsic properties of the electroplating system; and $i^*/4\phi_1$, which depends on the applied over-potential.

At normal plating potentials, $i^*$ is exponential in $\phi_1$. Hence, $i^*/4\phi_1$ can be reduced by lowering the applied potential $\phi_1$. There is, however, a lower limit to $i^*/4\phi_1$. At low over potentials (i.e., $\phi_1 < 1$) where equation (7) reduces to its linear form, $i^*/4\phi_1$ approaches a constant on the order of 1, and $\xi i^*/4\phi_1$ becomes independent of potential. Therefore, the polarization parameter $\xi$ ultimately determines the maximum uniformity that can be achieved in a particular electroplating system. For example, values of $\xi$ less than 0.1 would be required to provide metal layer thickness variations of less than 10% across the substrate.

It should be noted that while this illustration has been expressed in terms of copper electroplating on a barrier film on a silicon wafer, the derivation is general. The behavior of different metals, substrates, and resistive films can be inferred from the dimensionless parameter of equation (9). The dimensionless parameter of equation (9) is, by definition, greater than zero, and is preferably less than approximately 1.

In a preferred embodiment, a low polarization parameter $\xi$ combined with a low current density $i^*$ can be used to achieve a metal layer with substantially uniform thickness. In general, $i^*$ is less than approximately 10, and is preferably between 0.5 and 3. As $i_o$ is decreased, the plating current density is must be decreased to obtain a current density $i^*$ on the order of approximately 1.

EXAMPLE

As an example, consider a thin conductive layer deposited on a resistive substrate, which is a 6-inch wafer of silicon. The thin conductive layer is a 500 Å thick barrier film of titanium nitride (TiN). Electrical contacts are substantially uniformly placed around and at the wafer perimeter. The film conductivity $\kappa$ for TiN is 6700 $(\text{ohm-cm})_{-1}$. The film resistance parameter Rf is 1700 ohm-cm$^2$.

Experiments show that the barrier film of TiN is too resistive to allow copper electroplating from conventional electroplating baths onto the wafer. For example, consider a bath containing $5 \times 10^{-4}$ mole/cm$^3$ of $CuSO_4 \cdot 5(H_2O)$, which contains enough $H_2SO_4$ to maintain high solution conductivity. Sulfuric acid concentrations would generally fall between $0.5 \times 10^{-3}$ to $3 \times 10^{-3}$ mole/cm$^3$ (or 0.5M to 3M), and preferably around $1.5 \times 10^{-3}$ to $2.5 \times 10^{-3}$ mole/cm$^3$ (or 1.5M to 2.5M). Further, 10 to 100 ppm of HCl would also be present, with or without trace organic additives. A nominal plating current density $i_s$ of 20 mA/cm$^2$ electroplates copper near the contact points but fails to electroplate copper at measurable rates over most of the wafer. Little benefit is gained by lowering the plating current density $i_s$ by a factor of 10, 100, or more.

For copper electroplating, the exchange current density $i_o$ is given by $2Fk_s[Cu^{+2}]^\gamma$, where the first order rate constant $k_s$ is approximately $1 \times 10^{-4}$ cm/s in the absence of organic additives; the cathodic transfer coefficient $\alpha_c$ is approximately 0.5; the anodic transfer coefficient $\alpha_a$ is approximately 1.5; and $\gamma$ is assumed to be 1. The exchange current density $i_o$ is therefore approximately 10 mA/cm$^2$.

For a discussion of the cathodic transfer coefficient $\alpha_c$, the anodic transfer coefficient $\alpha_a$, the organic additive thiourea, and the first order rate constant $k_s$, see Z. D. Stankovic and M. Vukovic, "The influence of thiourea on kinetic parameters on the cathodic and anodic reaction at different metals in $H_2SO_4$ solution", *Electrochimica Acta*, v. 41, n. 16, p. 2529 (1996), and E. E. Farndon, F. C. Walsh, and S. A. Campbell, "Effect of thiourea, benzotriazole and 4,5-dithiaoctane-1,8-disulphonic acid on the kinetics of copper deposition from dilute acid sulphate solutions", *J. Appl. Electrochem.*, v. 25, p. 574 (1995).

For the present example of conventional copper electroplating, $\xi=330$, $i^*=2$, and $\Phi=0.75$, which are all dimensionless. Therefore, the dimensionless parameter $\xi i^*/4\Phi=220$ is much greater than unity, and uniform electroplating is not possible. Further, by only lowering the plating current density $i_s$, uniform electroplating does not result because $i^*/4\Phi$ approaches a limiting value of 1 at low plating current densities.

For the process of the present invention, the current distribution represented by equation (6), solved analytically for the limit of low current density ($i^* < 1$), is shown in FIG. 4 for several values of $\xi$. FIG. 4 illustrates the radial position and the normalized plating rate for electroplating copper in the linear regime (i.e., $\phi_{1<1}$). As can be seen from FIG. 4, substantially uniform thickness can be achieved for copper electroplating for $\xi$ on the order of approximately 10 or less. For $\xi$ on the order of approximately 1, the plated copper thickness at the center region of the wafer (i.e., x<0.5) is approximately 65% the thickness at the edge of the wafer. Further, for $\xi$ on the order of approximately 0.3, the plated copper thickness at the center region of the wafer is approximately 85% the thickness at the edge of the wafer.

As shown in FIG. 4, to electroplate uniformly across the wafer, $\xi$ is preferably on the order of approximately 10 or less, and preferably less than approximately 1.

With the present invention, for example, low kinetics are provided by using the same bath as the conventional bath, but with a lower copper ion concentration of $1.5 \times 10^{-6}$ mole/cm$^3$ (or 1.5 mM). At this copper concentration, $i_o$=3×10$^{-2}$ mA/cm$^2$, $\xi$=1, $i^*$=1, $\Phi$=0.3, and $\xi i^*/4\Phi$=0.8. The electroplated copper is substantially uniform, as shown in FIG. 4. As the electroplated copper layer builds up, the sheet resistance $\rho_s$ decreases, and therefore the value of $\xi$ decreases. Once the copper layer is 1,000 Å thick, the film resistance parameter Rf has decreased to less than 10 ohm-cm$^2$.

In an alternative embodiment, after the film resistance parameter Rf has decreased to less than 10 ohm-cm$^2$ because of the metal layer being formed, the metal ion concentration can be increased to increase the plating rate of the copper.

In an alternative embodiment, after the film resistance parameter Rf has decreased to less than 10 ohm-cm$^2$ because of the metal layer being formed, the sample is then transferred to a conventional electroplating bath, where no rinsing is preferably required. A bulk copper layer can then be deposited using the conventional electroplating bath because the copper layer is thick enough to permit conventional electroplating.

In an alternative embodiment, the plating current density $i_s$ is increased with the increasing film thickness. Preferably, the dimensionless parameter $\xi i^*/4\phi_1$ is kept constant during the increasing of the plating current density $i_s$.

As discussed above, the low values of $\xi$ for the present invention can be achieved by examining the polarization parameter $\xi$ in equation (1) and adjusting the parameters therein. For example, a low copper ion concentration results in a low $\xi$. Moreover, because $\xi$ is linear with respect to the exchange current density $i_o$, additives, like thiourea, can be added to the electroplating bath to lower the electroplating kinetics and hence reduce $\xi$. Moreover, both providing a low copper ion concentration in the electroplating bath and adding additives to the electroplating bath can be performed together. For example, if the addition of thiourea lowers $k_s$ by an order of magnitude to 1.1×10$^{-5}$ cm/s, then $i_o$ can be further lowered by 2 orders of magnitude by using a copper ion concentration of 1×10$^{-5}$ mole/cm$^3$ (or 10 mM), reducing $\xi$ to 0.35. Substantially uniform plating is achieved, as illustrated in FIG. 4.

In an alternative embodiment, to obtain a more uniform thickness for the metal layer, pulse electroplating can be used to partially correct the non-uniform electroplating current distribution on the edges of the resistive substrate. For example, for copper and for $\xi$ of less than approximately 10, this may be desirable. First, electroplating is performed in the least non-uniform low current density region to form the metal layer. Next, for short periods of time, the metal is periodically etched at high current density and high non-uniformity. In a preferred embodiment, the high spots of the metal layer are etched, and a net positive electroplating rate is maintained. In a preferred embodiment, the electroplating rate at the center of the wafer is at least within an order of magnitude of the edge plating rate, resulting in progress toward building a uniformly thick metal layer.

The present invention has been described in detail with respect to preferred embodiments. It will now be apparent from the foregoing to those skilled in the art that changes and modifications may be made without departing from the present invention. In its broader aspects, the present invention, as defined in the appended claims, is intended to cover all such changes and modifications as filed within the true spirit of the invention.

What is claimed is:

1. A process of electroplating metal onto a resistive substrate, wherein a resistive substrate is a substrate having a film resistance parameter Rf greater than approximately 10 ohm-cm$^2$, where Rf is defined as Rf=$r_1^2$/κh, and wherein said resistive substrate comprises any physical form conducive to electroplating, the process comprising:

electroplating a metal layer directly onto the resistive substrate in a first electroplating bath having a polarization parameter $\xi$ less than approximately 10, wherein the polarization parameter $\xi$ is defined as $\xi=i_o r_1^2 \alpha_c F/\eta hRT$, where $i_o$ is the exchange current density of the electroplating bath; $r_1^2$ is the square of the maximum distance between a point of the electroplated area and the nearest point of electrical contact with a power supply lead; $\alpha_c$ is the cathodic transfer coefficient; F is Faraday's constant; $\eta$ is the conductivity of the metal; h is the thickness of the metal layer; R is the gas constant; and T is the temperature.

2. A process according to claim 1 wherein the polarization parameter $\xi$ is less than approximately 1.

3. A process according to claim 1 wherein the metal layer is substantially uniform.

4. A process according to claim 1 further comprising:

providing a metal ion concentration of less than approximately 0.25×10$^{-3}$ mole/cm$^3$ in the first electroplating bath to obtain the polarization parameter $\xi$ less than approximately 10.

5. A process according to claim 1 further comprising:

adding an additive to the first electroplating bath to obtain the polarization parameter $\xi$ less than approximately 10.

6. A process according to claim 5 wherein the additive comprises one of a polyamine, a polyether, and a sulfur-containing organic brightener.

7. A process according to claim 5 wherein the additive comprises thiourea.

8. A process according to claim 1 wherein the resistive substrate has a film resistance parameter Rf greater than approximately 100 ohm-cm$^2$.

9. A process according to claim 1 wherein the resistive substrate comprises a conductive plastic, a carbon-filled plastic, an insulator with a resistive coating, or a resistive porous electrode.

10. A process according to claim 1 wherein the metal comprises copper, silver, gold, nickel, tin, solder, chromium, zinc, or bronze.

11. A process according to claim 1 wherein said resistive substrate is a layered material formed by providing a thin resistive film on a first resistive material before electroplating the metal layer, wherein the thin resistive film comprises a second material other than the first resistive material.

12. A process according to claim 11 wherein the resistive substrate comprises silicon, gallium arsenide, or a dielectric.

13. A process according to claim 11 wherein the thin resistive film is a barrier film.

14. A process according to claim 11 wherein the thin resistive film comprises titanium nitride, titanium silicide, titanium nitride silicide, tantalum, tantalum nitride, tantalum silicide, or tantalum nitride silicide.

15. A process according to claim 1, wherein said resistive substrate is a layered material formed by depositing an initial metal layer on a resistive substrate before electroplating the metal layer.

16. A process according to claim 15, wherein the initial metal layer is deposited by sputtering, chemical vapor deposition, or electroless plating.

17. A process according to claim 1, wherein electroplating comprises pulse electroplating.

18. A process according to claim 1 further comprising:

increasing a metal ion concentration in the first electroplating bath to a metal ion concentration greater than an original metal ion concentration, the original metal ion concentration being the metal ion concentration of the first electroplating bath prior to beginning the process, after an electroplated metal layer builds up, causing the effective resistance of the combined metal layer and the resistive substrate to decrease, permitting the electroplating rate to be increased.

19. A process according to claim 1 further comprising:

transferring the resistive substrate to a second electroplating bath after an electroplated metal layer builds up, causing the effective resistance of the combined metal layer and the resistive substrate to decrease, permitting the electroplating rate to be increased, said second electroplating bath having a metal ion concentration higher than an original metal ion concentration of the first electroplating bath, the original metal ion concentration of the first electroplating bath being the metal ion concentration of the first electroplating bath prior to beginning the process.

20. A process according to claim 1 further comprising:

increasing a plating current density $i_s$ in the first electroplating bath in relation to increasing thickness of the metal layer while keeping a dimensionless parameter $\xi i^*/4\phi_1$ less than approximately one, in which $\xi$ is the polarization parameter; $i^*=i_s/i_o$; and $\phi_1$ is a dimensionless potential $\phi$ evaluated at any electrical contact point of the substrate, where $\phi=\alpha_c F\eta/RT$, $\eta$ being an interfacial over-potential.

21. A process of electroplating metal onto a resistive substrate, wherein a resistive substrate is a substrate having a film resistance parameter Rf greater than approximately 10 ohm-cm$^2$, where Rf is defined as $Rf=r_1^2/\eta h$, and wherein said resistive substrate comprises any physical form conducive to electroplating, the process comprising:

electroplating a metal layer directly onto the resistive substrate in a first electroplating bath having a polarization parameter $\xi$ less than approximately 10 and a dimensionless parameter $\xi i^*/4\phi_1$ less than approximately 10, wherein the polarization parameter $\xi$ is defined as $\xi=i_o r_1^2 \alpha_c F/\eta hRT$, where $i_o$ is the exchange current density of the electroplating bath; $r_1^2$ is the square of the maximum distance between a point of the electroplated area and the nearest point of electrical contact with a power supply lead; $\alpha_c$ is the cathodic transfer coefficient; F is Faraday's constant; $\eta$ is the conductivity of the metal; h is the thickness of the metal layer; R is the gas constant; and T is the temperature; and wherein $i^*=i_s/i_o$, where $i_s$ is a plating current density, and $\phi_1$ is a dimensionless potential $\phi$ evaluated at any electrical contact point of the substrate, where $\phi=\alpha_c F\eta/RT$, $\eta$ being an interfacial over-potential.

22. A process according to claim 21, wherein the dimensionless parameter is kept less than approximately one.

23. A process according to claim 22, further comprising:

increasing said plating current density $i_s$ in the first electroplating bath in relation to increasing thickness of the metal layer.

24. A process according to claim 21, further comprising:

increasing a metal ion concentration in the first electroplating bath to a metal ion concentration greater than an original metal ion concentration, of the first electroplating bath, the original metal ion concentration of the first electroplating bath being the metal ion concentratration of the first electroplating bath prior to beginning the process, after an electroplated metal layer builds up, causing the effective resistance of the combined metal layer and the resistive substrate to decrease, permitting the electroplating rate to be increased.

25. A process according to claim 21, further comprising:

transferring the resistive substrate to a second electroplating bath after an electroplated metal layer builds up, causing the effective resistance of the combined metal layer and the resistive substrate to decrease, permitting the electroplating rate to be increased, said second electroplating bath having a higher metal ion concentration than an original metal ion concentration of the first electroplating bath, the original metal ion concentration of the first electroplating bath being the metal ion concentration of the first electroplating bath prior to beginning the process.

26. A process according to claim 21 further comprising:

increasing a plating current density $i_s$ in the first electroplating bath in relation to increasing thickness of the metal layer, while maintaining said dimensionless parameter at a value less than approximately 10.

* * * * *